(12) United States Patent
McCullough

(10) Patent No.: US 6,478,997 B2
(45) Date of Patent: Nov. 12, 2002

(54) POLYMER HEAT PIPE WITH CARBON CORE

(75) Inventor: Kevin A. McCullough, Warwick, RI (US)

(73) Assignee: Cool Options, Inc., Warwick, RI (US)

(*) Notice: Subject to any disclaimer, the term of this patent is extended or adjusted under 35 U.S.C. 154(b) by 4 days.

(21) Appl. No.: 09/726,140

(22) Filed: Nov. 29, 2000

(65) Prior Publication Data
US 2002/0064618 A1 May 30, 2002

Related U.S. Application Data
(60) Provisional application No. 60/169,151, filed on Dec. 6, 1999.

(51) Int. Cl.[7] .................. B29C 47/00; B29C 45/00
(52) U.S. Cl. ............. 264/108; 264/171.26; 264/177.15; 264/209.1; 264/328.16; 428/35.7; 165/104.26
(58) Field of Search .................. 428/35.7, 36.4, 428/36.5; 165/104.26, 185; 264/108, 171.26, 171.1, 177.15, 209.1, 328.18, 328.16

(56) References Cited

U.S. PATENT DOCUMENTS

| 5,219,021 | A | * | 6/1993 | Edelstein et al. ............ 122/366 |
| 5,242,644 | A | * | 9/1993 | Thompson et al. .... 264/177.15 |
| 5,464,585 | A | * | 11/1995 | Fitzgibbon .................. 264/108 |
| 6,284,184 | B1 | * | 9/2001 | Choi et al. .................. 264/139 |
| 6,365,076 | B1 | * | 4/2002 | Bhatia ........................ 264/105 |

* cited by examiner

Primary Examiner—Mark Eashoo
(74) Attorney, Agent, or Firm—Barlow, Josephs & Holmes, Ltd.

(57) ABSTRACT

A polymer heat pipe with a carbon core and a method of forming such a heat pipe is disclosed. The heat pipe includes a substantially pure carbon fiber core and an outer jacket of substantially pure polymer material. The heat pipe is formed by extruding a mixture of a base of polymer material and a plurality of carbon fibers through an extrusion die. The extrusion die is heated into a range of approximately 250–400° F. to cause the carbon fiber to migrate to the center of the extrudate and the polymer to migrate outwardly. As a result, a jacket of polymer material is formed around a core of carbon fibers to form a highly thermally conductive heat pipe.

10 Claims, 1 Drawing Sheet

POLYMER HEAT PIPE WITH CARBON CORE

This application claims the benefit of Provisional application Ser. No. 60/169,151, filed Dec. 6, 1999.

BACKGROUND OF THE INVENTION

The present invention relates generally to the cooling of heat generating surfaces and objects. More specifically, the present invention relates to apparatuses for dissipating heat generated by such objects. In addition, the present invention relates to cooling of heat generating objects by use of composite materials and devices without the use of external fans to assist in cooling.

In industry, there are various parts and components that generate heat during operation. For example, in the electronics and computer industries, it is well known that computer components generate heat during operation. Various types of electronic device packages and integrated circuit chips, such as the PENTIUM central processing unit chip (CPU) manufactured by Intel Corporation and RAM (random access memory) chips are such devices that generate heat. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

There are a number of prior art methods to cool heat generating components and objects to avoid device failure and overheating, as discussed above. A block heat sink or heat spreader is commonly placed into communication with the heat generating surface of the object to dissipate the heat therefrom. Such a heat sink typically includes a base member with a number of individual cooling members, such as fins, posts or pins, to assist in the dissipation of heat. The geometry of the cooling members is designed to improve the surface area of the heat sink with the ambient air for optimal heat dissipation. The use of such fins, posts of pins in an optimal geometrical configuration greatly enhances heat dissipation compared to devices with no such additional cooling members, such as a flat heat spreader.

To further enhance air flow and resultant heat dissipation, fans and devices have been used, either internally or externally. However, these external devices consume power and have numerous moving parts. As a result, heat sink assemblies with active devices are subject to failure and are much less reliable than a device which is solely passive in nature.

It has been discovered that more efficient cooling of electronics can be obtained through the use of passive heat pipes which require no external power source and contain no moving parts. Generally, known heat pipes are in the form a vacuum-tight vessel in a particular geometric shape which is evacuated and partially filled with a working fluid. The heat pipe passively transfers heat from a heat source to a heat sink where heat is dissipated. As the heat is conducted into the heat pipe, the fluid is vaporized in an evaporator section creating a pressure gradient in the heat pipe. This forces the vapor to flow along the heat pipe to the condenser section, where the vaporized fluid is condensed and turned back to its fluid state by giving up its latent heat of vaporization. The working fluid is then returned to the evaporator section to repeat the process of removing the heat generated by the heat source. One method used to achieve cooling by use of a heat pipe places the evaporator section at the lower end and the condenser section at the upper end where the heat pipe is in a substantially vertical position. Once the working fluid has been condensed, the liquid flows by gravity back to the evaporator section. Internal wick structures may be used to assist liquid flow back to the evaporator section by capillary action to reduce the effect of gravity on the device.

However, the foregoing known heat pipes suffer from many disadvantages making them inappropriate for many applications. For example, known heat pipes are typically orientation sensitive, particularly those without an internal wicking system. Since heat pipes are charged under pressure with the appropriate media, they cannot be punctured. Therefore, known heat pipes are sensitive to impact. Moreover, it is difficult to insert mold known heat pipes because the pressure of the molding pressure can easily collapse and destroy a heat pipe rendering it useless, particularly if the vacuum is breached.

In view of the foregoing, there is a demand for a heat pipe that is capable of dissipating heat. There is a demand for a heat pipe with no moving parts that can provide heat dissipation without the use of active components. In addition, there is a demand for a heat pipe that can provide greatly enhanced heat dissipation over prior art heat pipes. There is a further demand for a heat pipe that is rugged and more impact resistant than prior art heat pipes.

SUMMARY OF THE INVENTION

The present invention preserves the advantages of prior art heat dissipation devices, heat exchangers, heat spreaders and heat pipes. In addition, it provides new advantages not found in currently available devices and overcomes many disadvantages of such currently available devices.

The invention is generally directed to the novel and unique extruded or molded heat pipe. The present invention relates to heat pipes for dissipating heat from a heat generating source, such as a computer semiconductor chip or electronic components on a computer circuit board.

The present invention provides a polymer heat pipe with a carbon core and a method of forming such a heat pipe. The heat pipe includes a substantially pure carbon fiber core and an outer jacket of substantially pure polymer material. The heat pipe is formed by extruding a mixture of a base of polymer material and a plurality of carbon fibers through an extrusion die. The extrusion die is heated into a range of approximately 250–400° F. to cause the carbon fiber to migrate to the center of the extrudate and the polymer to migrate outwardly. As a result, a jacket of polymer material is formed around a core of carbon fibers to form a highly thermally conductive heat pipe.

It is therefore an object of the present invention to provide a heat pipe that can provide enhanced heat dissipation for a heat generating component or object.

It is an object of the present invention to provide a heat pipe that can provide heat dissipation for semiconductor devices on a circuit board, such as a motherboard.

It is a further object of the present invention to provide a heat dissipating device that has no moving parts.

Another object of the present invention is to provide a heat dissipating device that is completely passive and does not consume power.

A further object of the present invention is to provide a heat dissipation device that inexpensive to manufacture.

Another object of the present invention is to provide a heat pipe that has a thermal conductivity greater that conventional heat pipe designs.

A object of the present invention is to provide a heat pipe that is easily formable into a wide array of configurations.

Yet another objection of the present invention is to provide a heat pipe that has a thermal conductivity far superior to known heat pipes.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
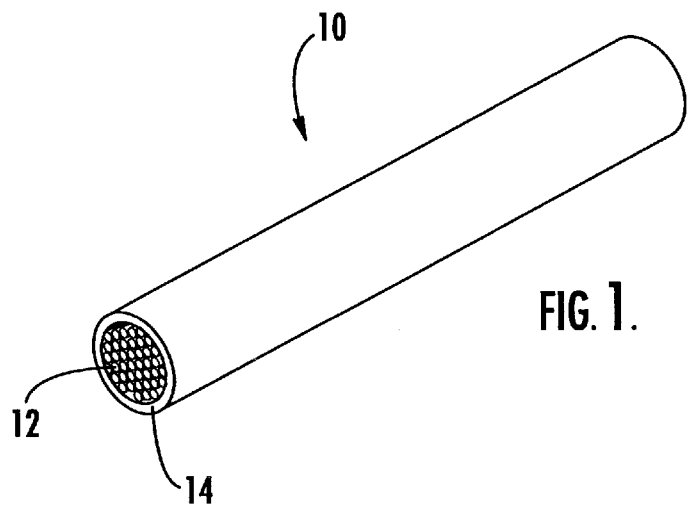
FIG. 1 is a perspective view of the heat pipe in accordance with the present invention.

Referring first to FIG. 1, a polymer heat pipe 10 with a carbon core 12, in accordance with the present invention, is shown. The heat pipe 10 is shown, by way of example, to be of a straight tubular construction with a circular cross-section. However, it is envisioned that the heat pipe 10 may be formed of a wide array of configurations and cross-sections and still be within the scope of the present invention. For example, the heat pipe 10 may be of a flattened shape with a rectangular cross-section. Further, the heat pipe 10 may be formed of a bent or serpentine configuration to meet the needs of the application at hand. Such a bent configuration may be employed where it is desired, for example, to conduct heat from a laptop microprocessor in the center of the machine to a heat sink assembly proximal to a fan at the outer periphery of the machine. A bent heat pipe may be desired so that the path of heat may be directed around various components within the machine.

Still referring to FIG. 1, the heat pipe construction 10 is shown to include an inner core 12 of carbon fiber which is preferably PITCH-based material. The carbon fiber runs the entire length of the heat pipe 10 and is surrounded by an outer jacket 14 of insulative polymer material. As will be discussed below, small amounts of polymer material may remain situated between the carbon fibers as a result of the method of the present invention. Further, some carbon fibers may remain embedded within the outer jacket 14 of polymer material. In general, the outer jacket 14 is, essentially, pure polymer material while the inner core 12 is, essentially, pure carbon fiber material.

The pure carbon fiber core 12 of the heat pipe 10 of the present invention provides highly thermally conductive conduit or heat pipe 10 for the movement of heat. In the prior art, a pure carbon fiber heat conduit is not possible because of the associated loading limitations and wet-out requirements of the base polymer matrix. With the present invention, effective near 100 percent "loading" is achieved in continuous core 12. An insulative polymer jacket 14 protects the carbon fiber core 12 and further contains the heat conducted therethrough. As a result of the a tightly packed carbon core 12 and outer protective polymer jacket 14, the thermal conductivity of the heat pipe 10 along its length can reach 100 W/m° K and possibly higher. Therefore, the heat pipe 10 of the present invention is well suited for demanding heat dissipation applications, such as the cooling of semiconductor devices in computer environments.

In connection with the method of forming the heat pipe 10, a base insulative material is first provided. The base is preferably a polymer material, such as polyethylene but may be other materials. Carbon fibers, such as PITCH-based carbon having an aspect ratio of, preferably 50:1. These carbon fibers typically have a thermal conductivity of approximately 800 W/m° K. The carbon fibers are mixed with the polymer base material to form a mixture. Preferably, the carbon fibers and polymer are preferably mixed in equal parts by volume. However, other mixtures may be provided to modify the volume and size of the carbon fiber core and the thickness of the polymer jacket.

Figure 2:
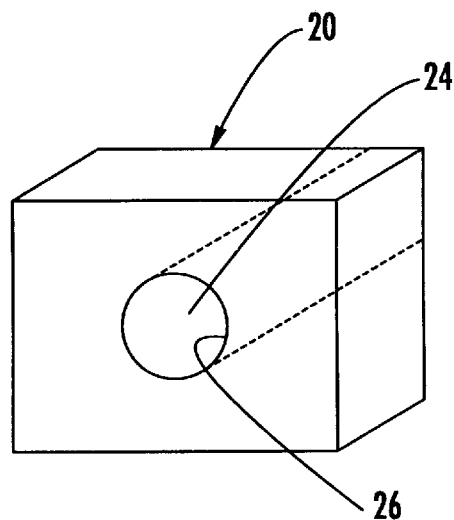
FIG. 2 is a perspective view of an extrusion die used in accordance with the method of the present invention.
Figure 3:
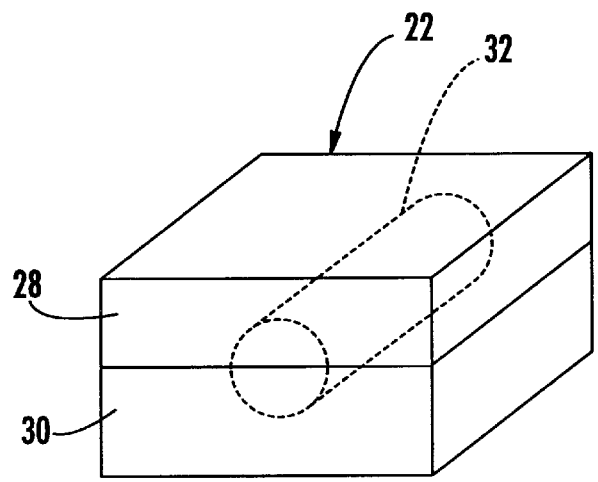
FIG. 3 is a perspective view of a mold used in accordance with the method of the present invention.

The mixture is then fed into the appropriate forming apparatus. As shown in FIGS. 2 and 3, an extrusion die 20 or, alternatively, an injection mold 22 may be employed. The extrusion die 20 and mold 22 are operated at a temperature of approximately 400° F. to impart high heat to the mixture. Depending on the mold 22 or extrusion die 20 and the type of polymer and carbon fiber used, the operating temperature may be as low as 250° F. or even greater than 400° F.

If extrusion is desired, the polymer and carbon fiber mixture is passed through the orifice 24 in the extrusion die 20. As the mixture passes through the die 20, the heat of the die draws the polymer base material toward the inner wall 26 of the orifice 24 of the extrusion die 20. Simultaneously, the carbon fiber is drawn in an opposite direction toward the center of the orifice 24 as the mixture exits from the extrusion die 20. The exiting formed heat pipe 10, in this example, may be cut to any desired length and even bent and configured further prior to complete curing and hardening. The extrusion die 20 shown in FIG. 2 provides for a simple tubular heat pipe configuration 10, the result of which is shown in FIG. 1. Other extrusion die components, such as cutters, feeds, input ports and gates are not shown as they are well known in the art.

As an alternative to the extrusion die 20 shown in FIG. 2, an injection mold 22 may be used to form the heat pipe 10 in accordance with the present invention. The method of the present invention may employ an injection mold 22, as shown in FIG. 3, as an alternative to the extrusion die 20 of FIG. 2. The injection mold 22 includes a top half 28 and a bottom half 30 with a mold cavity 32 defined therein. The injection mold 22 shown in FIG. 3, by way of example, shows an elongated tubular heat pipe configuration. In certain applications, it may be more desirable to injection mold the mixture of polymer and carbon fiber. For example, an injection mold 22 is capable of forming more complex product geometries than an extrusion die 20 in not only the X and Y directions but also in the Z direction. However, certain applications and heat pipe configurations may be more well suited for formation by an extrusion process.

Below is an example and preferred embodiment of the present invention.

EXAMPLE

A base matrix of liquid crystal polymer is provided as 50 percent (by volume) of the composition mixture. Pitch-based carbon fiber, with an aspect ratio of approximately 50:1 and independent thermal conductivity of approximately 800 W/m° K, is provided as approximately 50 percent (by volume) of the composition mixture. The polymer and carbon fiber are combined and mixed to form a composition mixture. An extrusion die, having an output aperture of approximately 1⁄4 of an inch is heated to approximately 400° F. The mixture of polymer and carbon fiber is passed through the extrusion die and is subsequently cooled. The resultant heat pipe has a 3⁄8 of an inch core of substantially pure carbon fiber and an outer jacket of approximately 1⁄16 of an inch substantially pure polymer material.

It would be appreciated by those skilled in the art that various changes and modifications can be made to the illustrated embodiments without departing from the spirit of the present invention. All such modifications and changes are intended to be covered by the appended claims.

What is claimed is:

1. A method of forming a polymer heat pipe, comprising the steps of:
   providing a base of polymer material;
   providing a plurality of carbon fibers;
   mixing said plurality of carbon fibers in said base of polymer material to form a mixture;
   providing a mold having a cavity with an outer wall;
   introducing said mixture into said mold;
   heating said mold and said mixture;
   migrating said polymer material toward said outer wall;
   migrating said carbon fiber away from said outer wall; and
   forming a jacket of said polymer material around a core of said carbon fibers.

2. The method of claim 1, wherein said heating said mold and said mixture is carried out at approximately 400° F.

3. The method of claim 1, wherein said heating said mold and said mixture is carried out in the range of approximately 250–400° F.

4. The method of claim 1, wherein said jacket of said polymer material is approximately 1⁄16 of an inch thick.

5. The method of claim 1, wherein said core of said carbon fibers is about 3⁄8 of an inch thick.

6. A method of forming a polymer heat pipe, comprising the steps of:
   providing a base of polymer material;
   providing a plurality of carbon fibers;
   mixing said plurality of carbon fibers in said base of polymer material to form a mixture;
   providing an extrusion die having an exit port with an outer wall;
   passing said mixture through said extrusion die;
   heating said die and said mixture;
   migrating said polymer material toward said outer wall;
   migrating said carbon fiber away from said outer wall; and
   forming a jacket of said polymer material around a core of said carbon fibers.

7. The method of claim 6, wherein said heating said extrusion die and said mixture is carried out at approximately 400° F.

8. The method of claim 6, wherein said heating said extrusion die and said mixture is carried out in the range of approximately 250–400° F.

9. The method of claim 6, wherein said jacket of said polymer material is approximately 1⁄16 of an inch thick.

10. The method of claim 6, wherein said core of said carbon fibers is approximately 3⁄8 of an inch thick.

* * * * *